United States Patent
Kaynak et al.

(10) Patent No.: US 11,829,245 B2
(45) Date of Patent: Nov. 28, 2023

(54) MULTI-LAYER CODE RATE ARCHITECTURE FOR COPYBACK BETWEEN PARTITIONS WITH DIFFERENT CODE RATES

(71) Applicant: Micron Technology, Inc., Boise, ID (US)

(72) Inventors: Mustafa N. Kaynak, San Diego, CA (US); Kishore Kumar Muchherla, Fremont, CA (US); Sivagnanam Parthasarathy, Carlsbad, CA (US); James Fitzpatrick, Laguna Niguel, CA (US); Mark A. Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/696,245

(22) Filed: Mar. 16, 2022

(65) Prior Publication Data
US 2023/0297470 A1    Sep. 21, 2023

(51) Int. Cl.
*G06F 11/10* (2006.01)
*H03M 13/29* (2006.01)

(52) U.S. Cl.
CPC ..... *G06F 11/1068* (2013.01); *H03M 13/2906* (2013.01)

(58) Field of Classification Search
CPC ................ H03M 13/2906; G06F 11/1068
See application file for complete search history.

(56) References Cited

U.S. PATENT DOCUMENTS

| 2007/0133329 A1* | 6/2007 | Braun | G11C 11/4078 365/212 |
| 2014/0006898 A1* | 1/2014 | Sharon | G06F 12/0246 714/755 |
| 2018/0091172 A1* | 3/2018 | Ilani | G06F 11/1068 |

* cited by examiner

*Primary Examiner* — Guy J Lamarre
(74) *Attorney, Agent, or Firm* — Greenberg Traurig

(57) ABSTRACT

Systems, methods, and apparatus related to a multi-level error correction architecture used for copying data in memory devices. In one approach, user data is stored in the first partition of a non-volatile memory. First error correction code data is generated for the user data and stored with the user data in the first partition. Second error correction code data is generated for the user data and stored outside the first partition. The second error correction code data provides an increased error correcting capability that is compatible with the error correction algorithm used with the first error correction code data. A copyback operation is used to copy the user data and the first error correction code, but not the second error correction code, to a second partition of the non-volatile memory. The second error correction code can be selectively used if there is a need to recover portions of the user data stored in the first partition.

33 Claims, 6 Drawing Sheets

MULTI-LAYER CODE RATE ARCHITECTURE FOR COPYBACK BETWEEN PARTITIONS WITH DIFFERENT CODE RATES

FIELD OF THE TECHNOLOGY

At least some embodiments disclosed herein relate to memory devices in general, and more particularly, but not limited to a multi-layer code rate architecture for a memory device that stores data using error correction with different code rates.

BACKGROUND

Various types of non-volatile storage devices can be used to store data. Non-volatile storage devices can include NAND flash memory devices. NAND flash is a type of flash memory constructed using NAND logic gates.

A solid state drive is an example of a non-volatile data storage device that uses solid-state memory to store data in, for example, non-volatile NAND-based flash memory chips. NAND-based flash memories are generally reliable, but do not store data error-free. In some cases, an error correction code is used to correct raw bit errors in the stored data.

Errors in data storage may occur for various reasons. For example, errors may be caused by noise at power rails, voltage threshold disturbances during reading or writing of neighboring cells, or retention loss due to leakage within the cells.

Error correction codes are often used in flash memories to recover stored data if an error is detected. In one example, an error correction code supplements user data with parity bits that store additional information so that the data can be recovered if one or more data bits are corrupted. In general, the number of data bit errors that can be corrected in the stored data increases as the number of parity bits in the error correction code increases.

In memory devices, the user data is stored in a memory location of the memory device along with the error correction code for the data. This permits the data and error correction code to be written to the memory location in a single write operation, or read from the memory location in a single read operation. Typically, the error correction code is implemented in the flash memory controller.

In one example, the error correction code generates parity bits that are stored with the user data. In various examples, the error correction code is based on a Hamming coding scheme, a Reed-Solomon coding scheme, a turbo code coding scheme, or a low-density parity check (LDPC) coding scheme.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
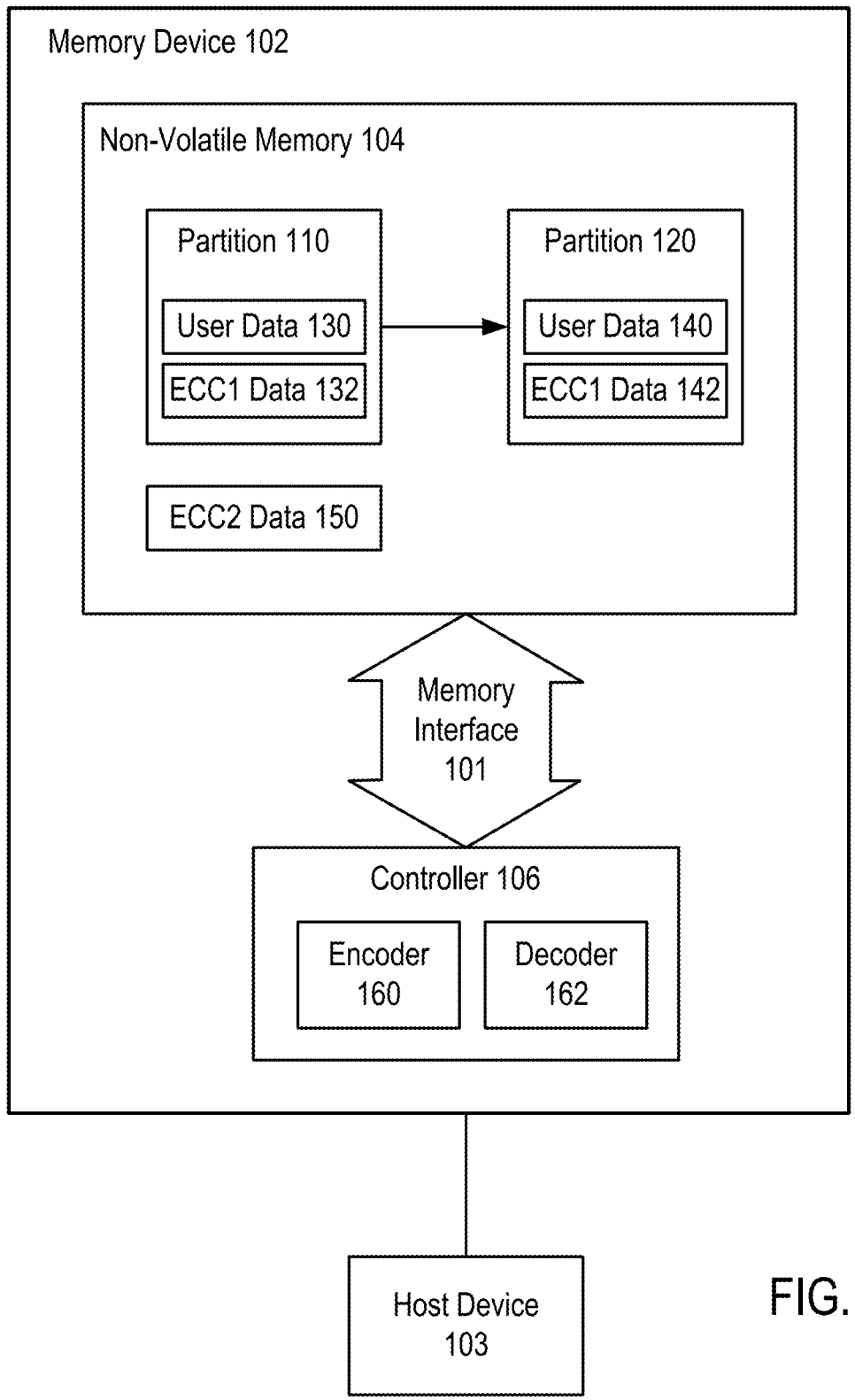
FIG. 1 shows a memory device that uses a multi-layer code rate architecture to store data in different partitions of a non-volatile memory using error correction at different code rates, in accordance with some embodiments.

The following disclosure describes various embodiments for memory devices implementing a multi-layer (also referred to as multi-level) code rate architecture that stores data using error correction with different code rates for different partitions of a non-volatile memory. At least some embodiments herein relate to flash memory devices. At least some embodiments herein relate to data stored in a memory device based on encoding the data using two levels of parity protection. The memory device may, for example, store data for a host device (e.g., a computing device of an autonomous vehicle, a server, or other computing device that accesses data stored in a memory device). In one example, the memory device is a solid-state drive (SSD) mounted in an electric vehicle.

In one example, a NAND flash memory device stores data (e.g., pages) that is programmed in various modes: an SLC (single level cell) mode, an MLC (multi-level cell) mode, a TLC (triple level cell) mode, or a QLC (quad level cell) mode, etc. When configured in the SLC mode, each memory cell stores one bit of data. When configured in the MLC mode, each memory cell stores two bits of data. When configured in the TLC mode, each memory cell stores three bits of data. When configured in the QLC mode, each memory cell stores four bits of data. When the number of bits stored in a cell increases, the likelihood of errors in the data retrieved from the cell increases.

The time required to program a memory cell varies depending on the mode. For example, programming in the QLC mode is significantly slower than programming in SLC mode. In particular, each QLC cell has 16 possible states called levels (e.g., levels 0 to 15). Level 0 is an erased state (not programmed).

Programming of the QLC cells can be done in one pass, but because of cell-to-cell coupling (which causes interference), if programming is done in only one pass, the error rate will be high. As an example of an error, in some cases when one cell is programmed to a level 1, and a neighboring cell is programmed to a higher level, there is coupling interference, which causes the level 1 to move to a higher level. This can cause an error.

QLC cells can be programmed in two passes to reduce the above negative effects. In the first pass, coarse programming is done. In the second pass, finer programming is done to more finely tune the coarse programming. Threshold voltage distributions for the cells will be tighter and more usable when using two-pass programming (e.g., 16-16 programming).

In some cases, a host device sends data to a flash memory device at a faster rate than the incoming data can be written in QLC memory, especially if programming with the two-pass approach above. As an example, if a user is recording high-definition video on a mobile device, the fast rate of data provided to the memory device for storage cannot be slowed down. If the data is not saved sufficiently fast (e.g., due to slow QLC programming), then data can be lost due to the real-time recording nature of this activity.

In some cases, memory devices attempt to remedy this problem by initially writing incoming user data to memory cells operating in an SLC mode. This is because programming (writing) in SLC mode can be performed relatively fast, and thus an incoming real-time stream of data can be saved without data loss. In some approaches, a memory device has dedicated SLC blocks to store incoming data. Alternatively, SLC blocks can be assigned dynamically. For example, each block in a memory device can be selectively operated in an SLC or QLC mode.

In one example, after storing data in SLC mode, mobile devices can compact the data during an idle time (e.g., when processor demand is low). Data can be compacted, for example, by moving the data from SLC cells to QLC cells during the idle time.

However, the above use of SLC blocks for storing incoming data presents a technical problem in that SLC mode memory cells (as do flash memory cells in general) have limited endurance (e.g., a limited program-erase cycling capability). In one example, 2 GB of memory may be dedicated to SLC blocks in a 128 GB drive, and the remaining 126 GB is used for QLC blocks to store user data. All of the data stored in the QLC mode cells is first stored in the SLC mode cells when initially received. Thus, the SLC mode cells experience significantly more stress than the QLC mode cells (e.g., which in some cases may only write data one or a few times). This causes the SLC mode cells to more rapidly wear over time than the QLC mode cells. There is a stress from programming the SLC mode cells as data is received. The stress on cells is even worse for erase of the cells in NAND devices. Errors associated with the SLC mode cells thus increase due to the greater stress and usage.

In one example, 128 GB of QLC mode data is equivalent to 4×128 GB of SLC mode data (e.g., in terms of program-erase cycles as regards wear such as above). For example, the SLC memory cells in a device can cycle 50,000 times. If the endurance of the SLC memory cells is low, then the size of the SLC block must be increased, which takes away from actual available user data storage capacity. Thus, the cost per GB of QLC mode for user data is greater due to increased usage of a portion of the total memory storage capacity as an input SLC buffer (e.g., which only temporarily stores the user data until compacted).

As mentioned above, error rates continue to increase during the life of a memory device as SLC mode memory cells are programmed and erased because of the wear. For example, the errors may occur between storing data into memory cells (e.g., SLC memory cells used as storage media in non-volatile memory chips of an SSD) and retrieving data from memory cells. To facilitate the retrieval of error-free data, a controller (e.g., used in the SSD) can encode data received from a host device using an error correction code (ECC), such as a low-density parity-check (LDPC) code, and store the encoded data in the memory cells. Decoding the encoded data retrieved from the memory cells can remove or reduce errors.

ECC is, for example, additional information added to user data that permits correction of errors (e.g., the addition of 10% or 20% of parity bits or data to the user data). The additional information is used by an error correction engine (e.g., an encoder and decoder implemented in a controller of an SSD).

More powerful error correction is desired for the SLC mode cells when used for incoming data due to the higher error rates above due to greater stress and usage. The more powerful correction extends the useful life of the SLC blocks. However, this higher level of error correction is not desired in QLC mode cells, which have a lower error rate, to avoid waste of storage capacity. As an example, a memory device needs 20% additional error correction information (e.g., 20% parity bits) on SLC mode cells, but 10% additional information (e.g., 10% parity bits) is sufficient for QLC mode cells. This creates the technical problem of a mismatch in error correction data needs. If you use 20% additional ECC data for QLC mode cells, then there is significant waste of memory storage space.

This mismatch is even further pronounced in memory devices that use copyback operations to copy data from SLC blocks to QLC blocks. In a copyback operation, data is copied exactly as it is stored in the SLC blocks and moved to the QLC blocks without using error correction. If 20% parity data is stored in the SLC blocks, then all of this 20% parity data is copied exactly to the QLC blocks. This causes the wasted storage space in the QLC mode cells as described above.

Copyback is generally used in memory devices for efficiency. For example, some NAND flash memory devices have a copyback mode. During copyback, data is read in SLC mode and written back to QLC mode without doing any error correction. Copyback can be desirable, for example, when SLC mode data error rates are low, and the data has not been sitting for a long time. For example, copyback has an advantage in that the data never leaves the NAND device. This is because the copyback operation is fully performed internally within the NAND device.

An alternative to using the copyback operation is to read data from the SLC blocks in one or more NAND dies to a controller (e.g., ASIC), correct errors using the parity data stored in the SLC blocks, then write the data back to QLC blocks in the NAND dies. However, the interface between the NAND dies that store the SLC blocks and the controller is a shared resource (e.g., an ONFI bus). Thus, this correcting of errors using the controller will block any read or program requests because the interface is busy. In contrast, the copyback operation does not block any read or program requests because it does not use the interface. Thus, there is a need to use copyback operations for efficiency in compacting user data, but to perform the compacting in a way that overcomes the problem of a mismatch in error correction data needs.

In one example, a memory device has QLC blocks that use a 16-16 algorithm where coarse data ($1^{st}$ pass) has a very high error rate. An SLC buffer is used to buffer the coarse data. The size of the SLC buffer is configured based on endurance as discussed above. Increasing the size of the SLC buffer adds to the cost per GB of storage. In operation, data is written to the SLC buffer and then relocated to the QLC blocks. Reading the data from the SLC buffer to an ASIC controller of the memory device, correcting the data, and re-writing the data to QLC block fine programming ($2^{nd}$ pass) causes a huge performance penalty due to ONFI bus overhead. Thus, SLC to QLC copyback is generally used by the memory device to avoid this penalty. However, this does not remedy the technical problem of error correction mismatch above.

Although smaller code rates may increase the endurance of SLC blocks, this takes away from the size of the user payload and reduces the user density for a given NAND capacity. Smaller code rates are undesirable in QLC mode for this reason. Although SLC buffer partitions may benefit from a smaller code rate, using a smaller code rate on an SLC buffer and a default (larger) code rate on QLC blocks can make the SLC-to-QLC copyback incompatible. Thus, there is a need for a memory device that operates the SLC buffer at a smaller code rate than QLC blocks, but supports SLC-to-QLC copyback (without LDPC intervention by the controller).

To address these and other technical problems, a memory device implements a multi-level code rate architecture that stores data using error correction with different code rates for different partitions of a non-volatile memory. For example, SLC blocks for a first partition use error correction for user data with 20% parity data, and QLC blocks for a second partition use error correction for the user data with 10% parity data.

However, unlike prior approaches, for the first partition the 20% parity data is split into two parts, each corresponding to compatible levels of error correcting capability. A first part of 10% parity data is stored in the first partition (SLC blocks) with user data. A second part of compatible 10% parity data (for a higher level of error correction) is stored outside of the SLC blocks, but is available to the controller if needed for error correction of the user data.

Copyback is used to compact data from the SLC blocks to the QLC blocks. Thus, only the first part of 10% parity data is copied to the QLC blocks. This provides a match between error correction capability for SLC and QLC blocks, while at the same time providing an available greater error correction capability for the SLC blocks.

In one embodiment, incoming user data is initially stored in single-level cell (SLC) flash memory at a smaller code rate (e.g., 0.8 for 20% parity data), and then copied to and stored in quad-level cell (QLC) flash memory at a larger code rate (e.g., 0.9 for 10% parity data). The parity data for the user data is generated using two-level encoding and includes first ECC data (ECC1) corresponding to a first level, and second ECC data (ECC2) corresponding to a second level (that provides greater error correction than the first level).

The first ECC data is stored in the same SLC partition as the user data. The second ECC data is stored in a different partition. Storing the second ECC data outside of the partition having the user data permits use of a copyback operation to copy the user data from the SLC partition to a QLC partition. The user data and first ECC data are identically copied, but the copyback operation does not copy the second ECC data since it is in a different partition from the user data. This approach permits the incoming user data to be initially stored at an initial code rate, and then to be later stored at a different code rate.

This architecture is useful, for example, for correcting errors for data stored in an input buffer or other memory region (e.g., SLC block) used to receive incoming user data. The input buffer can sometimes exhibit higher error rates than other regions of a memory (e.g., due to excessive wear as discussed above). Having a higher error correction capability for the SLC region enables the system to do more program/erase operations on the SLC region. The second ECC data provides a greater error correction capability to satisfy the greater error correction needs of the input buffer or region. When the incoming user data is later copied to another region of the memory (e.g., QLC block) for longer-term storage (e.g., using a copyback operation), the error correction needs are less (e.g., when stored in the QLC block). Copying only the first ECC data, but not the second ECC data, is sufficient to satisfy these reduced error correction needs, and permits storing the user data more compactly so that total memory capacity is more efficiently used.

In one embodiment, a NAND flash memory device includes non-volatile memory (e.g., on one or more NAND die) and a controller (e.g., an ASIC). The non-volatile memory has a first partition (e.g., an SLC block) and a second partition (e.g., a QLC block). The first partition is configured to store data in memory cells each storing a single bit of data, and the second partition is configured to store data in memory cells each storing two or more bits of data.

The controller is configured to: generate first error correction code (ECC) data for user data, wherein the first ECC data provides a first capability for correcting at least one error in the user data; store the user data and the first ECC data in the first partition; generate second ECC data for the user data, wherein a combination of the first ECC data and the second ECC data provides a second capability for correcting at least one error in the user data, and the second capability is able to correct a greater number of errors than the first capability; store the second ECC data outside of the first partition; and copy the user data to the second partition using either a first mode of copyback operation or a second mode using error correction. The controller can select to use either mode of copying the user data as desired (e.g., as determined by a state machine, machine learning model, and/or firmware).

Copying the user data using the copyback operation includes copying of the user data and the first ECC data to the second partition without error correction. Copying the user data using error correction includes performing error correction for the user data using the combination of the first and second ECC data.

Various advantages are provided by embodiments described herein. In one advantage, a multi-layer error correction code (ECC) is used to support copyback between two partitions operating at different code rates. One SLC partition operates at a lower code rate for endurance benefit. Another QLC partition operates at a larger code rate for cost benefit. For example, this helps reduce the over-provisioning (OP) penalty incurred due to the SLC partition, but without hurting SLC-to-QLC copyback functionality.

FIG. 1 shows a memory device 102 that uses a multi-layer code rate architecture to store data in different partitions (e.g., partitions 110, 120) of a non-volatile memory 104 using error correction at different code rates, in accordance with some embodiments. Memory device 102 is, for example, an SSD or other storage device, or a NAND-based flash memory chip or module that encodes stored data using two levels of parity data.

Controller 106 controls access to non-volatile memory 104. User data 130 is provided by controller 106 to non-volatile memory 104 over memory interface 101. Controller 106 includes encoder 160 for generating ECC data (e.g., when writing data), and decoder 162 for decoding ECC data (e.g., when reading data).

Memory device 102 receives data to be stored from host device 103 (e.g., over a serial communications interface, or a wireless communications interface). Memory device 102 stores the received data in memory cells (not shown) of non-volatile memory 104. In one example, the memory cells may be provided by one or more non-volatile memory chips. In one example, the memory chips are NAND-based flash memory chips.

Memory device 102 implements error correction by generating ECC1 data 132 and ECC2 data 150 using user data 130. ECC2 data 150 has a higher error correction capability than ECC1 data 132. For example, as user data 130 is received from host device 103, the received data is encoded using encoder 160 to provide the ECC1 and ECC2 data (e.g., parity bits). Controller 106 can implement error correction in hardware and/or software. In one example, the user data 130 is video data from a mobile device of a user, or sensor data from one or more sensors of an autonomous or other vehicle.

As incoming user data 130 is received from host device 103, user data 130 is stored in partition 110 along with ECC1 data 132 that has been generated by encoder 160. In one example, partition 110 includes SLC blocks as described above. ECC2 data 150 is stored outside of partition 110 in non-volatile memory 104. ECC2 data 150 is generated by encoder 160 as user data 130 is received from host device 103.

After being stored in partition 110, user data 130 is copied to partition 120. In one example, partition 120 includes QLC blocks as described above. In one example, this copying is performed to compact the user data 130 so that it is stored as user data 140 in partition 120 with greater storage density. In one example, the copying is performed when controller 106 determines that resources of memory device 102 are idle or have an availability that exceeds a threshold.

In one embodiment, user data 130 is copied to partition 120 using a copyback operation as described above. During this copyback, user data 130 and ECC1 data 132 are copied from partition 110 to partition 120 in an identical form without performing error correction by controller 106. Thus, user data 140 and ECC1 data 142 as written to partition 120 is an identical copy of user data 130 and ECC1 data 132. It should be noted that ECC2 data 150 is not copied during this copyback operation because ECC2 data 150 is outside of partition 110.

ECC2 data 150 may be stored in another partition of non-volatile memory 104, and/or may be stored in other memory of memory device 102. In some embodiments, ECC2 data 150 may be stored in local memory of controller 106 and/or memory of host device 103. In some embodiments, error correction using ECC2 data 150 may be performed by controller 106 and/or host device 103.

When copying user data 130 from partition 110 to partition 120, controller 106 makes a determination whether the copying should be performed using a copyback operation or using error correction. For example, controller 106 may determine to use the copyback operation when an error rate associated with user data 130 as stored in partition 110 is estimated to be below a threshold. As an example, if data in partition 110 has higher retention, it could have a higher error rate.

In contrast, if the error rate is estimated to be above the threshold, controller 106 may determine to perform the copying using error correction. In this case, user data 130 is sent over memory interface 101 to controller 106 for error correction using decoder 162. The error correction can be performed using ECC1 data 132 and/or ECC 2 data 150 (as may be needed depending on an extent of estimated errors in user data 130). The corrected user data 130 is then copied to partition 120 as user data 140. ECC1 data 142 is generated by encoder 160 using the corrected user data 130.

Figure 2:
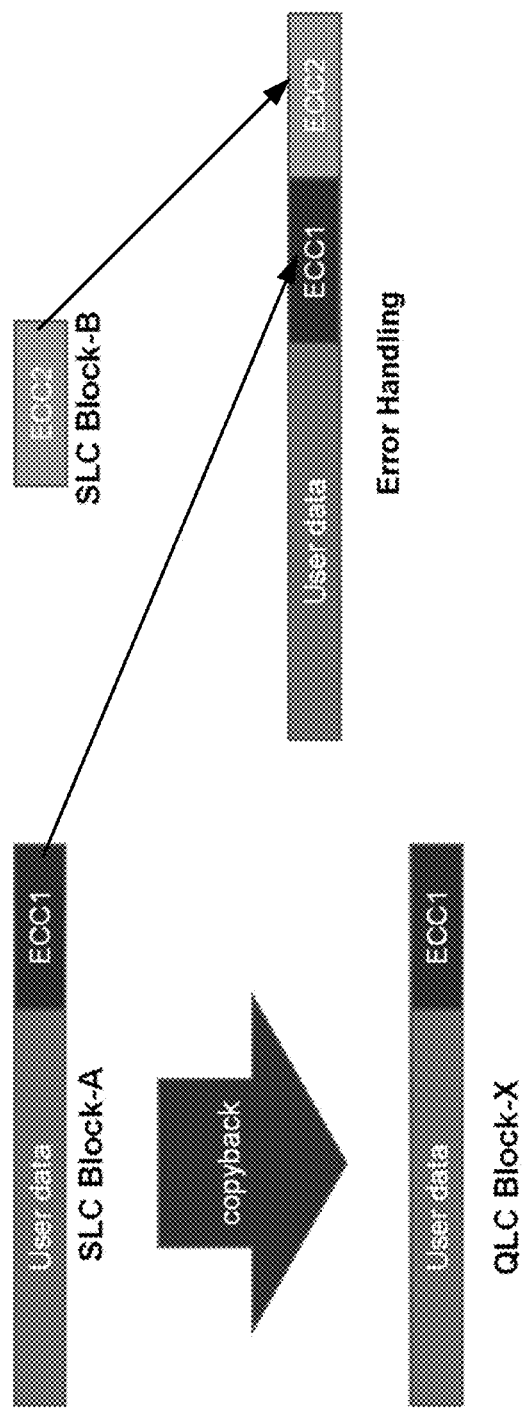
FIG. 2 shows a copyback operation and an error handling flow for a memory device using a multi-layer code rate architecture, in accordance with some embodiments.

FIG. 2 shows a copyback operation and an error handling flow for a memory device using a multi-layer code rate architecture, in accordance with some embodiments. In one example, the memory device is memory device 102. In one example, the copyback operation identically copies user data 130 from partition 110 to partition 120.

In one example, as illustrated, user data and ECC1 data are stored in an SLC block A and copied to a QLC block X. ECC2 data is stored in a different SLC block B. As illustrated, error handling to correct identified errors in the user data can be performed using ECC1, or if needed for greater error correction, a combination of ECC1 and ECC2.

In one embodiment, error handling (e.g., reading the data to the controller to correct the errors as opposed to doing a copyback) can be initiated by a controller (e.g., controller 106) based on determining a context associated with the non-volatile memory that is storing the user data. For example, the error handling can be initiated based on a determination of a temperature or a change in temperature of the memory and/or an environment in which the memory is located. For example, the error handling can be initiated based on a determination of an error rate associated with the stored user data in SLC block A. For example, the error handling can be initiated based on a time period for which the user data has been stored in SLC block A.

In one example, the error handling can be initiated based on an extent of prior usage of SLC block A. The prior usage may be determined based on, for example, a counter that counts a number of program-erase cycles performed on memory cells in SLC block A.

In one embodiment, an error correction architecture for a memory device generates some modularity in codeword construction such that part of the ECC bytes written to an SLC page can be truncated and yet be ECC correctable. Two levels of encoding are used. The corresponding parity check matrix (e.g., H matrix which generates the parity bits for the ECC) is generated accordingly. In a way, the parity check matrix for 20% code (e.g., $\hat{H}$ matrix) needs to have the H matrix for 10% code. The memory device generates 10% parity in a first step (ECC1) (e.g., for 0.9 code rate), and then using this information the memory device generates an additional 10% parity (ECC2) (e.g., for 0.8 code rate).

In one example, user data and ECC1 data is written to SLC Block-A. ECC2 data is written to SLC Block-B. For copyback, the user data and ECC1 data from the SLC Block-A is used and copied to QLC Block-X. For error handling, the user data and ECC1+ECC2 from SLC Block-A and Block-B are concatenated together to generate a smaller code rate with larger ECC correction capability.

In one example, an SSD performs SLC to QLC (e.g., QLC Block-X) copyback with the user data+ECC1 data corresponding to a 0.9 code rate (user data+ECC1=code rate 0.9). The copyback does not include ECC2 bytes.

In one example, the SSD performs an error handling flow on SLC at code rate (CR) of 0.8 by concatenating ECC2 with ECC1 (user data+ECC1+ECC2 operates at code rate=0.8). The SSD uses ECC1+ECC2 for the non-copyback path.

In one example, the ECC2 data is stored separately from ECC1, but on the same die, or can be stored elsewhere in a different storage location.

In one example, when generating the ECC2 data, a controller can encode the user data+ECC1 bits, or can encode only the user data bits. An H matrix generates the ECC1 data, and a corresponding $\hat{H}$ matrix generates the ECC1 and ECC2 data.

In one example, when performing error handling for read failures, if user data in SLC fails to be corrected with ECC1 data, then controller can use ECC2 data to correct.

In one example, SLC data may have been stored for a long time (e.g., more than one day), or a controller writes the data at one temperature, and reads the data at a different temperature. The error rates typically will be higher, so that error handling can be selected for copying. In one example, a device reads the data to the controller for error correction. If the read fails with ECC1, then error handling uses ECC2 to recover the lost data. Then, the device writes the corrected data back to QLC for compaction of the data.

In one example, a controller decides whether to use copyback. For example, there is a need to compact some data using QLC. Before doing copyback, the controller checks to see what the error rates are for reads of the user data. If the errors are low, then the controller does the copyback. If errors are high, then the controller does not use copyback.

For example, a controller of a mobile device writes data at a very cold temperature, then the device is moved to a hot area, and the mobile device is now compacting the data. The controller check error rates before compacting. If reads fail at a rate above a threshold (controller cannot decode the data), then an error handling flow uses ECC2 to recover the data.

In one embodiment, a controller uses a flash translation logic (FTL) layer to keep track of the location of the stored ECC2 data in the non-volatile memory. In one example, the controller can look up a physical address of the ECC2 data when given a logical address (e.g., used by the host device with a write command).

Figure 3:
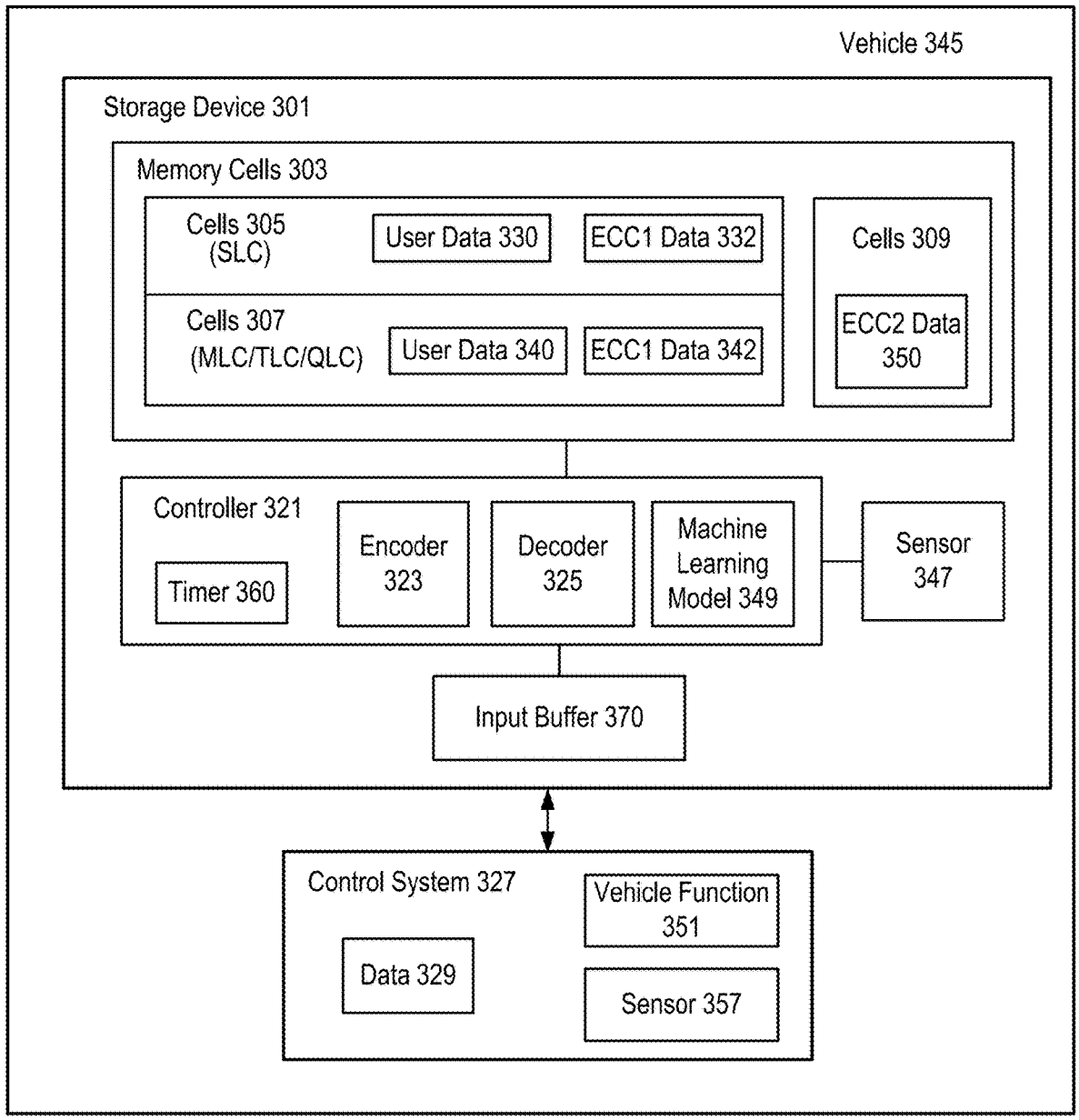
FIG. 3 shows a storage device that stores data for a control system of a vehicle using two-level error correction coding, in accordance with some embodiments.

FIG. 3 shows a storage device that 301 stores data for a control system 321 of a vehicle 345 using two-level error correction coding, in accordance with some embodiments. A first level of error correction coding is provided by using ECC1 data (e.g., ECC1 data 332), and a second level of error correction coding is provided by using ECC2 data (e.g., ECC2 data 350).

Control system 327 controls various vehicle functions 351 of vehicle 345. In one example, vehicle functions 351 include motor control, navigation control, and/or control of other hardware of vehicle 345 that performs operational functions when vehicle 345 is being used by an operator (e.g., a driver or passenger). Control system 327 stores data 329 that is used in controlling vehicle function 351.

Control system 327 can send at least portions of data 329 to storage device 301 for storage in memory cells 303. For example, a portion of data 329 is sent as user data 330, which is received by controller 321 from control system 327 and stored in memory cells 303. For example, user data 330 is encoded to generate ECC1 data and ECC2 data to provide parity data.

User data 330 is stored in input buffer 370 as it is received from control system 327. Controller 321 uses encoder 323 to generate ECC1 data 332 using the user data 330 in input buffer 370. Then, user data 330 and ECC1 data 332 are stored in memory cells 305 operating in an SLC mode. Encoder 323 also generates ECC2 data 350 using user data 330. The ECC2 data 350 is stored in memory cells 309 (e.g., operating in SLC mode).

Controller 321 determines whether to copy user data 330 to memory cells 307 (operating in MLC/TLC/QLC mode) using a copyback operation without error correction, or to first perform error correction by controller 321 using decoder 325 prior to copying to cells 307 as corrected user data 340. When using error correction, encoder 323 generates ECC1 data 342 using the corrected user data 340. ECC1 data 342 is stored in cells 307. If a copyback operation is used, then user data 330 is identically copied as user data 340, and ECC1 data 332 is identically copied as ECC1 data 342.

In one embodiment, controller 321 determines a temperature of storage device 301 using sensor 347 (e.g., a sensor embedded in a memory array). Signaling provided by sensor 347 is used by controller 321 as input to machine learning model 349 (e.g., an artificial neural network). An output from machine learning model 349 is used for operating storage device 301. Based at least in part on this output, controller 321 determines how to manage user data stored in memory cells 303.

In one example, controller 321 uses an output from machine learning model 349 to decide whether to use a copyback operation to copy user data 320 from cells 305 (operating in SLC mode) to cells 307 (operating in MLC/TCL/QLC mode), which stores user data 340 as an identical copy of user data 330.

As an alternative, the output from machine learning model 349 can be used as a basis for performing error correction for user data 330 stored in cells 305. If error correction is performed, the user data 330 can be sent to controller 321 for error correction using ECC1 data 332, and also ECC2 data 350 as may be needed.

Controller 321 includes timer 360 used for determining a time period that user data 330 is stored in cells 305. The time period can be used by controller 321 in determining whether to use a copyback operation or to perform error correction when copying user data 330. In one example, when the time period is greater than the threshold, controller 321 decides to use error correction when copying user data 330 to cells 307.

Control system 327 includes sensor 357 (e.g., a sensor mounted on a hardware component of vehicle 345). Data from sensor 357 can include temperature data and/or other data. The data from sensor 357 can be used by controller 321 in deciding how to manage user data 330, including whether to perform a copyback operation as described above or to perform error correction of user data 330.

Figure 4:
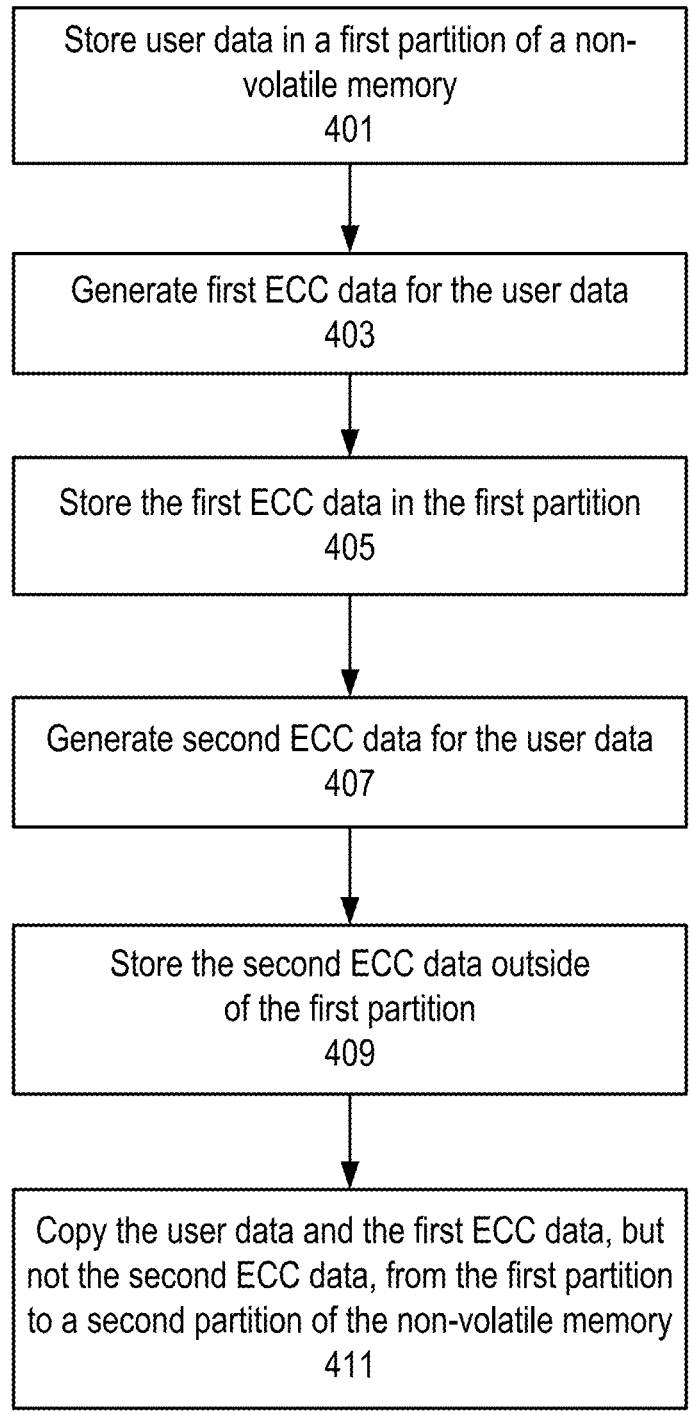
FIG. 4 shows a method for copying user data between partitions storing data using error correction at different code rates, in accordance with some embodiments.

FIG. 4 shows a method for copying user data between partitions storing data using error correction at different code rates, in accordance with some embodiments. For example, the method of FIG. 4 can be implemented in the system of FIG. 1.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., controller 106 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, user data is stored in a first partition of a non-volatile memory. In one example, user data 130 is stored in partition 110.

At block 403, first ECC data is generated for the user data. In one example, ECC1 data 132 is generated using encoder 160.

At block 405, the first ECC data is stored in the first partition. In one example, ECC1 data 132 is stored in partition 110 with user data 130. It should be noted that ECC1 data 132 and user data 130 can be stored in partition 110 at the same time (e.g., a single write operation by controller 106), or can be stored consecutively in either order.

At block 407, second ECC data is generated for the user data. In one example, ECC2 data 150 is generated by encoder 160 using user data 130.

At block 409, the second ECC data is stored outside of the first partition. In one example, ECC2 data 150 is stored in non-volatile memory 104 outside of partition 110.

At block 411, the user data and the first ECC data are copied from the first partition to a second partition of the non-volatile memory. The second ECC data is not copied to the second partition. In one example, controller 106 determines whether to copy user data 130 from partition 110 to partition 120 using a copyback operation or using error correction. In one example, the determination is based on availability of communication resources (e.g., memory interface 101) and/or processing resources (e.g., controller 106).

In one embodiment, a system comprises: non-volatile memory (e.g., 104) comprising a first partition (e.g., partition 110) (e.g., first SLC block(s)) and a second partition (e.g., partition 120) (e.g., QLC block(s)), wherein the first partition is configured to store data in memory cells each storing a single bit of data, and the second partition is configured to store data in memory cells each storing two or more bits of data; and a controller (e.g., 106) configured to: generate first error correction code (ECC) (e.g., ECC1 data 132) data for user data (e.g., user data 130), wherein the first ECC data provides a first capability for correcting at least one error in the user data; store the user data and the first ECC data in the first partition; generate second ECC data (e.g., ECC2 data 150) for the user data, wherein a combination of the first ECC data and the second ECC data provides a second capability for correcting at least one error in the user data, and the second capability is able to correct a greater number of errors than the first capability; store the second ECC data outside of the first partition; and copy the user data to the second partition using a copyback operation or using error correction (e.g., using decoder 162 and encoder 160). Copying the user data using the copyback operation comprises causing copying of the user data and the first ECC data to the second partition without error correction; and copying the user data using error correction comprises performing error correction for the user data using the combination of the first and second ECC data.

In one embodiment, the second ECC data is generated using the first ECC data.

In one embodiment, the combination of the first and second ECC data is a concatenation of the first and second ECC data.

In one embodiment, generating the first ECC data comprises generating a first parity check matrix (e.g., H matrix).

In one embodiment, generating the second ECC data comprises generating a second parity check matrix (e.g., Ĥ matrix) using the first parity check matrix.

In one embodiment, the second ECC data is stored in memory cells (e.g., second SLC block(s)) each configured to store a single bit of data.

In one embodiment, the second ECC data is stored in the non-volatile memory outside of the first and second partitions.

In one embodiment, the first ECC data corresponds to a first code rate (e.g., 0.9 for ECC1), the second ECC data corresponds to a second code rate (e.g., 0.8 for ECC1+ ECC2), and the second code rate is smaller than the first code rate.

In one embodiment, copying the user data to the second partition is performed without copying the second ECC data.

In one embodiment, the copyback operation further comprises reading the user data from the first partition and writing the user data to the second partition without communicating any of the user data to the controller.

In one embodiment, the copyback operation is a NAND flash internal copyback operation.

In one embodiment, a system comprises: non-volatile memory comprising a first partition and a second partition, wherein data stored in the first partition is stored in memory cells each configured to store charge representative of a single bit of data, and data stored in the second partition is stored in memory cells each configured to store charge representative of two or more bits of data; and a controller configured to: generate first error correction code (ECC) data for user data, wherein the first ECC data provides a first capability for correcting at least one error in the user data; store the user data and the first ECC data in the first partition; generate second ECC data for the user data, wherein a combination of the first ECC data and the second ECC data provides a second capability for correcting at least one error in the user data, and the second capability is able to correct a greater number of errors than the first capability; store the second ECC data outside of the first partition; and copy the user data to the second partition using a copyback operation or using error correction. Copying the user data using the copyback operation comprises causing copying of the user data and the first ECC data to the second partition without error correction; and copying the user data using error correction comprises copying the user data to the second partition with error correction using at least one of the first ECC data or the second ECC data.

In one embodiment, copying the user data using error correction is performed using the combination of first and second ECC data in response to determining that using the first ECC data without the second ECC data is insufficient to correct at least one error in the user data.

In one embodiment, generating the second ECC data comprises generating the second ECC data as a function of the first ECC data.

In one embodiment, copying the user data to the second partition using error correction further comprises: attempting error correction using the first ECC data without the second ECC data; and in response to determining a failure of the attempted error correction, performing error correction using the first and second ECC data.

In one embodiment, copying the user data to the second partition using error correction further comprises: correcting at least one error in the user data to provide corrected user data; generating, by an encoder, third ECC data for the corrected user data; and copying the corrected user data and the third ECC data to the second partition.

In one embodiment, the third ECC data provides the first capability for correcting at least one error in the user data.

In one embodiment, copying the user data to the second partition further comprises: determining a context associated with the stored user data; based on the determined context, determining to copy the user data using error correction to provide corrected user data; and copying the corrected user data to the second partition.

In one embodiment, determining the context comprises determining that the user data has been stored in the first partition for a time period (e.g., determined using timer 360) that exceeds a threshold.

In one embodiment, determining the context comprises determining that an estimated error rate associated with the stored user data is greater than a threshold.

In one embodiment, determining the context comprises evaluating at least one temperature associated with the stored user data. In one example, the temperature is determined based on data from sensor 347 and/or sensor 357.

In one embodiment, evaluating the temperature associated with the stored user data comprises determining at least one of a temperature when the user data was stored in the first partition, or a temperature when copying the user data to the second partition.

In one embodiment, determining the context comprises determining a number of program-erase cycles associated with the first partition.

In one embodiment, the controller is further configured to: receive a write command from a host device (e.g. 103); wherein the user data is stored in the first partition in response to receiving the write command.

In one embodiment, the first ECC data comprises first parity bits for a low-density parity check (LDPC) code.

In one embodiment, the second ECC data comprises second parity bits for the LDPC code.

In one embodiment, the controller is further configured to: determine an availability of at least one of processing resources (e.g., availability of processing bandwidth of controller 106) or communication resources (e.g., availability of bandwidth for memory interface 101); wherein copying the user data to the second partition is performed in response to determining that the availability is above a threshold.

In one embodiment, the processing resources include a processing capability of at least one processing device (e.g., controller 106).

In one embodiment, a method comprises: storing user data in a first partition of a non-volatile memory, wherein data stored in the first partition is stored in memory cells each configured to store charge representative of a single bit of data; generating first error correction code (ECC) data for the user data, wherein the first ECC data provides a first capability for error correction of the user data; storing the first ECC data in the first partition, wherein the first ECC data is associated with the stored user data; generating second ECC data for the user data, wherein a combination of the first ECC data and the second ECC data provides a second capability for error correction of the user data, and the second capability is greater than the first capability; storing the second ECC data outside of the first partition; and copying the user data and the first ECC data from the first partition to a second partition of the non-volatile memory, but without copying the second ECC data to the second partition, wherein data stored in the second partition is stored in memory cells each configured to store charge representative of two or more bits of data.

In one embodiment, copying the user data comprises: determining whether an error rate associated with the stored user data is greater than a threshold; and in response to determining that the error rate is greater than the threshold, correcting at least one error in the user data using the combination of the first ECC data and the second ECC data to provide corrected user data; wherein the corrected user data is written to the second partition.

In one embodiment, copying the user data comprises: determining whether an error rate associated with the stored user data is less than a threshold; wherein the user data is copied from the first partition to the second partition using a copyback operation in response to determining that the error rate is less than the threshold.

In one embodiment, the user data and the first ECC data are copied from the first partition to the second partition as part of a copyback operation.

In one embodiment, the copyback operation does not perform any error correction of the user data.

Figure 5:
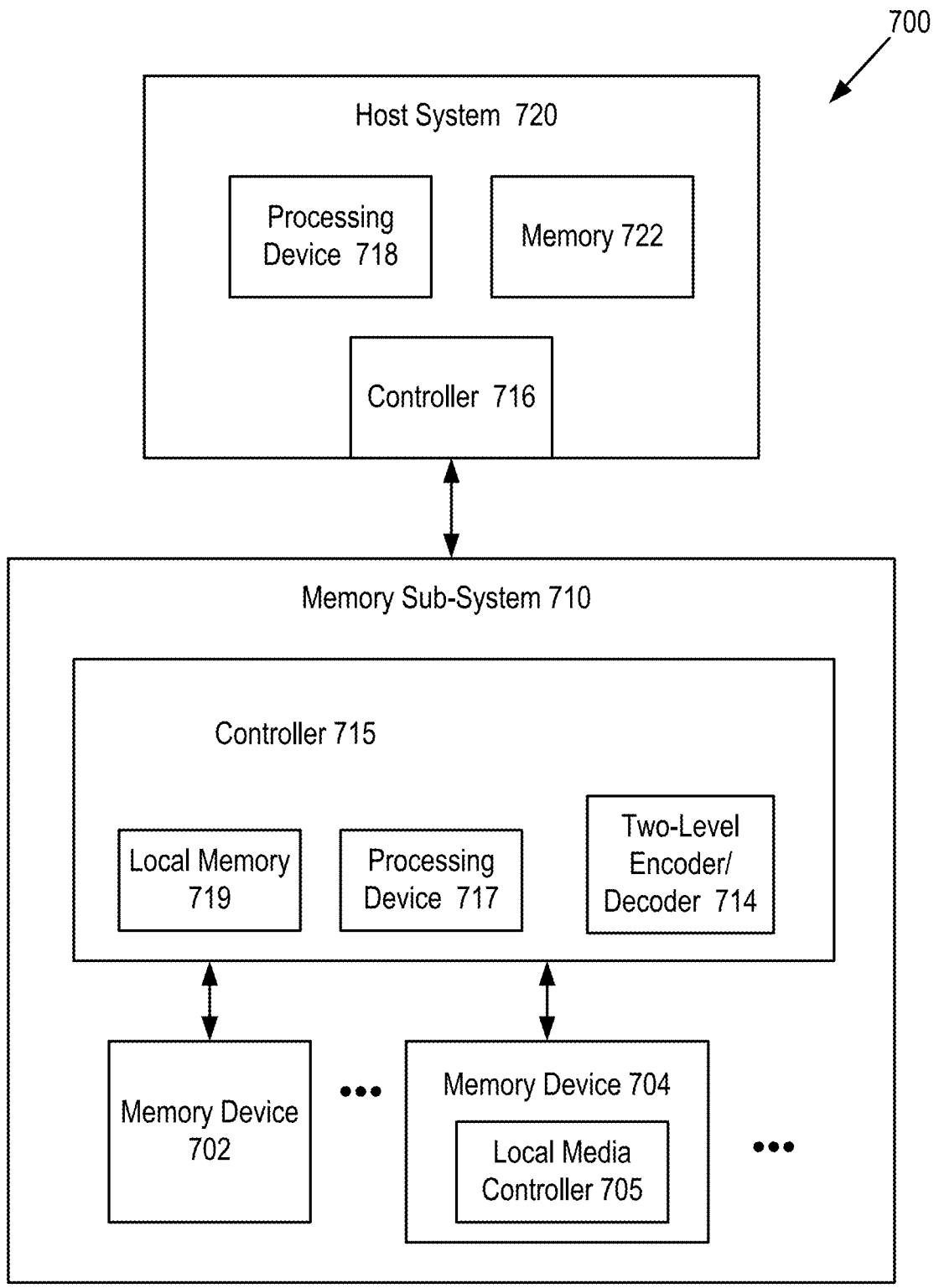
FIG. 5 shows an example computing system that includes a memory sub-system in accordance with some embodiments of the present disclosure.

FIG. 5 shows an example computing system that includes a memory sub-system in accordance with some embodiments of the present disclosure. In some embodiments, two-level encoding is used to encode data for storage in a memory sub-system. For example, ECC1 and ECC2 data are stored in separate partitions, as discussed above, for selecting copying using copyback or error correction (e.g., for data compaction).

In one example, a memory sub-system can be a storage device (e.g., memory device 102 or storage device 301), a memory module, or a hybrid of a storage device and memory module. Examples of storage devices and memory modules are described below in conjunction with FIG. 5. In general, a host system can utilize a memory sub-system that includes one or more components, such as memory devices that store data. The host system can provide data to be stored at the memory sub-system, and can request data to be retrieved from the memory sub-system.

FIG. 5 illustrates an example computing system 700 that includes memory sub-system 710 in accordance with some embodiments of the present disclosure. The memory sub-system 710 can include media, such as one or more volatile memory devices (e.g., memory device 702), one or more non-volatile memory devices (e.g., memory device 704), or a combination of such. Memory device 102 of FIG. 1 is an example of memory sub-system 710, and host device 103 is an example of host system 720.

A memory sub-system 710 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 700 can be, for example, a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 700 can include a host system 720 that is coupled to one or more memory sub-systems 710. FIG. 5 illustrates one example of a host system 720 coupled to one memory sub-system 710.

The host system 720 can include a processor chipset (e.g., processing device 718) and a software stack executed by the processor chipset. The processor chipset can include one or more cores, one or more caches, a memory controller (e.g., controller 716) (e.g., NVDIMM controller), and a storage protocol controller (e.g., PCIe controller, SATA controller). The host system 720 uses the memory sub-system 710, for example, to write data to the memory sub-system 710 and read data from the memory sub-system 710.

The host system 720 can be coupled to the memory sub-system 710 via a physical host interface. Examples of a physical host interface include, but are not limited to, a Serial Advanced Technology Attachment (SATA) interface, a Peripheral Component Interconnect Express (PCIe) interface, Universal Serial Bus (USB) interface, Fibre Channel, Serial Attached SCSI (SAS), a Double Data Rate (DDR) memory bus, Small Computer System Interface (SCSI), a Dual In-line Memory Module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 720 and the memory sub-system 710. The host system 720 can further utilize an NVM Express (NVMe) interface to access components (e.g., memory devices 704) when the memory sub-system 710 is coupled with the host system 720 by the PCIe interface. The physical host interface can provide an interface for passing control, address, data, and other signals between the memory sub-system 710 and the host system 720. FIG. 5 illustrates a memory sub-system 710 as an example. In general, the host system 720 can access multiple memory sub-systems via a same communication connection, multiple separate communication connections, and/or a combination of communication connections.

The processing device 718 of the host system 720 can be, for example, a microprocessor, a central processing unit (CPU), a processing core of a processor, an execution unit, etc. In some instances, the controller 716 can be referred to as a memory controller, a memory management unit, and/or an initiator. In one example, the controller 716 controls the communications over a bus coupled between the host system 720 and the memory sub-system 710. In general, the controller 716 can send commands or requests to the memory sub-system 710 for desired access to memory devices 702, 704. The controller 716 can further include interface circuitry to communicate with the memory sub-system 710. The interface circuitry can convert responses received from memory sub-system 710 into information for the host system 720.

The controller 716 of the host system 720 can communicate with controller 715 of the memory sub-system 710 to perform operations such as reading data, writing data, or erasing data at the memory devices 702, 704 and other such operations. In some instances, the controller 716 is integrated within the same package of the processing device 718. In other instances, the controller 716 is separate from the package of the processing device 718. The controller 716 and/or the processing device 718 can include hardware such as one or more integrated circuits (ICs) and/or discrete components, a buffer memory, a cache memory, or a combination thereof. The controller 716 and/or the processing device 718 can be a microcontroller, special purpose logic circuitry (e.g., a Field Programmable Gate Array (FPGA), an Application Specific Integrated Circuit (ASIC), etc.), or another suitable processor.

The memory devices 702, 704 can include any combination of the different types of non-volatile memory components and/or volatile memory components. The volatile memory devices (e.g., memory device 702) can be, but are not limited to, Random Access Memory (RAM), such as Dynamic Random Access Memory (DRAM) and Synchronous Dynamic Random Access Memory (SDRAM).

Some examples of non-volatile memory components include a Negative-AND (NAND) type flash memory and write-in-place memory, such as three-dimensional cross point memory. A cross point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 704 can include one or more arrays of memory cells (e.g., memory cells 303 of FIG. 3). One type of memory cell, for example, Single Level Cells (SLCs) can store one bit per cell. Other types of memory cells, such as Multi-Level Cells (MLCs), Triple Level Cells (TLCs), Quad-Level Cells (QLCs), and penta-level cells (PLCs) can store multiple bits per cell. In some embodiments, each of the memory devices 704 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 704 can be grouped as pages that can refer to a logical unit of the memory device used to store data. With some types of memory (e.g., NAND), pages can be grouped to form blocks.

Although non-volatile memory devices such as 3D cross point type and NAND type memory (e.g., 2D NAND, 3D NAND) are described, the memory device 704 can be based on any other type of non-volatile memory, such as Read-Only Memory (ROM), Phase Change Memory (PCM), self-selecting memory, other chalcogenide based memories, Ferroelectric Transistor Random-Access Memory (Fe-TRAM), Ferroelectric Random Access Memory (FeRAM), Magneto Random Access Memory (MRAM), Spin Transfer Torque (STT)-MRAM, Conductive Bridging RAM (CBRAM), Resistive Random Access Memory (RRAM), Oxide based RRAM (OxRAM), Negative-OR (NOR) flash memory, and Electrically Erasable Programmable Read-Only Memory (EEPROM).

A memory sub-system controller 715 (or controller 715 for simplicity) can communicate with the memory devices 704 to perform operations such as reading data, writing data, or erasing data at the memory devices 704 and other such operations (e.g., in response to commands scheduled on a command bus by controller 716). The controller 715 can include hardware such as one or more Integrated Circuits (ICs) and/or discrete components, a buffer memory, or a combination thereof. The hardware can include digital circuitry with dedicated (i.e., hard-coded) logic to perform the operations described herein. The controller 715 can be a microcontroller, special purpose logic circuitry (e.g., a Field Programmable Gate Array (FPGA), an Application Specific Integrated Circuit (ASIC), etc.), or another suitable processor.

The controller 715 can include a processing device 717 (processor) configured to execute instructions stored in a local memory 719. In the illustrated example, the local memory 719 of the controller 715 includes an embedded memory configured to store instructions for performing various processes, operations, logic flows, and routines that control operation of the memory sub-system 710, including handling communications between the memory sub-system 710 and the host system 720.

In some embodiments, the local memory 719 can include memory registers storing memory pointers, fetched data, etc. The local memory 719 can also include Read-Only Memory (ROM) for storing micro-code. While the example memory sub-system 710 in FIG. 5 has been illustrated as including the controller 715, in another embodiment of the present disclosure, a memory sub-system 710 does not include a controller 715, and can instead rely upon external control (e.g., provided by an external host, or by a processor or controller separate from the memory sub-system).

In general, the controller 715 can receive commands or operations from the host system 720 and can convert the commands or operations into instructions or appropriate commands to achieve the desired access to the memory devices 704. The controller 715 can be responsible for other operations such as wear leveling operations, garbage collection operations, error detection and error correction code (ECC) operations, encryption operations, caching operations, and address translations between a logical address (e.g., Logical Block Address (LBA), namespace) and a physical address (e.g., physical block address) that are associated with the memory devices 704.

The controller 715 can further include host interface circuitry to communicate with the host system 720 via the physical host interface. The host interface circuitry can convert the commands received from the host system into command instructions to access the memory devices 704 as well as convert responses associated with the memory devices 704 into information for the host system 720.

The memory sub-system 710 can also include additional circuitry or components that are not illustrated. In some embodiments, the memory sub-system 710 can include a cache or buffer (e.g., DRAM) and address circuitry (e.g., a row decoder and a column decoder) that can receive an address from the controller 715 and decode the address to access the memory devices 704.

In some embodiments, the memory devices 704 include local media controllers 705 that operate in conjunction with memory sub-system controller 715 to execute operations on one or more memory cells of the memory devices 704. An external controller (e.g., memory sub-system controller 715) can externally manage the memory device 704 (e.g., perform media management operations on the memory device 704). In some embodiments, a memory device 704 is a managed memory device, which is a raw memory device combined with a local controller (e.g., local controller 705) for media management within the same memory device package. An example of a managed memory device is a Managed NAND (MNAND) device.

In one embodiment, the computing system 700 includes a two-level encoder/decoder 714 in the memory sub-system 710 that uses at least two error correction codes (e.g., ECC1 and ECC2) to convert data and/or generate corresponding parity data for storing in media cells of memory devices 702 to 704. In some embodiments, the controller 715 in the memory sub-system 710 includes at least a portion of the two-level encoder/decoder 714. In other embodiments, or in combination, the controller 716 and/or the processing device 718 in the host system 720 includes at least a portion of the two-level encoder/decoder 714. For example, the controller 715, the controller 716, and/or the processing device 718 can include logic circuitry implementing the two-level encoder/decoder 714. For example, the controller 715, or the processing device 718 (processor) of the host system 720, can be configured to execute instructions stored in memory for performing the operations of the two-level encoder/decoder 714.

In some embodiments, the two-level encoder/decoder 714 is implemented in an integrated circuit chip disposed in the memory sub-system 710. In other embodiments, the two-level encoder/decoder 714 is part of an operating system of the host system 720, a device driver, or an application.

In some implementations, a communication channel between the processing device 718 and a memory sub-system 710 includes a computer network, such as a local area network, a wireless local area network, a wireless personal area network, a cellular communications network, a broadband high-speed always-connected wireless communication connection (e.g., a mobile network link); and the processing device 718 and the memory sub-system can be configured to communicate with each other using data storage management and usage commands similar to those in NVMe protocol.

A memory sub-system 710 in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, Phase-Change Memory (PCM), Magnetic Random Access Memory (MRAM), resistive random-access memory, cross point storage and memory devices. A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

The controller (e.g., 715) of a memory sub-system (e.g., 710) can run firmware to perform operations responsive to the communications from the processing device 718. Firmware in general is a type of computer program that provides control, monitoring and data manipulation of engineered computing devices.

Some embodiments involving the operation of the controller 715 can be implemented using computer instructions executed by the controller 715, such as the firmware of the controller 715. In some instances, hardware circuits can be used to implement at least some of the functions. The firmware can be initially stored in the non-volatile storage media, or another non-volatile device, and loaded into the volatile DRAM and/or the in-processor cache memory for execution by the controller 715.

A non-transitory computer-readable medium can be used to store instructions of the firmware of a memory sub-system (e.g., 710). When the instructions are executed by the controller 715 and/or the processing device 717, the instructions cause the controller 715 and/or the processing device 717 to perform a method discussed herein.

In one embodiment, a method (e.g., implemented in memory sub-system 710) copies data (e.g., using copyback or copying with error protection) that has previously been encoded using two-level encoding (e.g., encoding using encoder 160) as described for FIG. 1. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed at least in part by the two-level encoder/decoder 714 of FIG. 5.

In one embodiment, two-level encoder/decoder 714 decodes data retrieved from memory cells based on a first error correction code (e.g., ECC1; a low-density parity-check code). The two-level encoder/decoder 714 determines whether the decoding according to the first error correction code (e.g., ECC1) is successful. When all codewords generated using the first error correction code (e.g., ECC1) can be successfully decoded and/or recovered via the parity data, the original data based on which the encoded data is generated, stored in and then retrieved from the memory cells is recovered successfully and can be copied (e.g., to partition 120).

If some of the codewords cannot be successfully decoded according to the first error correction code (e.g., ECC1), the two-level encoder/decoder 714 identifies symbols that cannot be successfully decoded via the first error correction code. In one example, unsatisfied parity checks in an LDPC code can be used to identify bits in an LDPC codeword that cannot be reliably decoded. The identified symbols can be considered as missing/being erased. The second error correction code (e.g., ECC2) along with the first error correction code (e.g., ECC1) can then be used to decode those few ambiguous symbols (e.g., using parity data stored as ECC2 data 150). Decoding according to the second error correction code can be performed to recover the missing/erased symbols.

The two-level encoder/decoder 714 recovers the identified symbols based on, for example, ECC1 and ECC2. In one example, the recovered symbols can be used to replace the corresponding symbols retrieved from the memory cells and further decoded for data recovery via the first error correction code (e.g., a low-density parity-check code).

Figure 6:
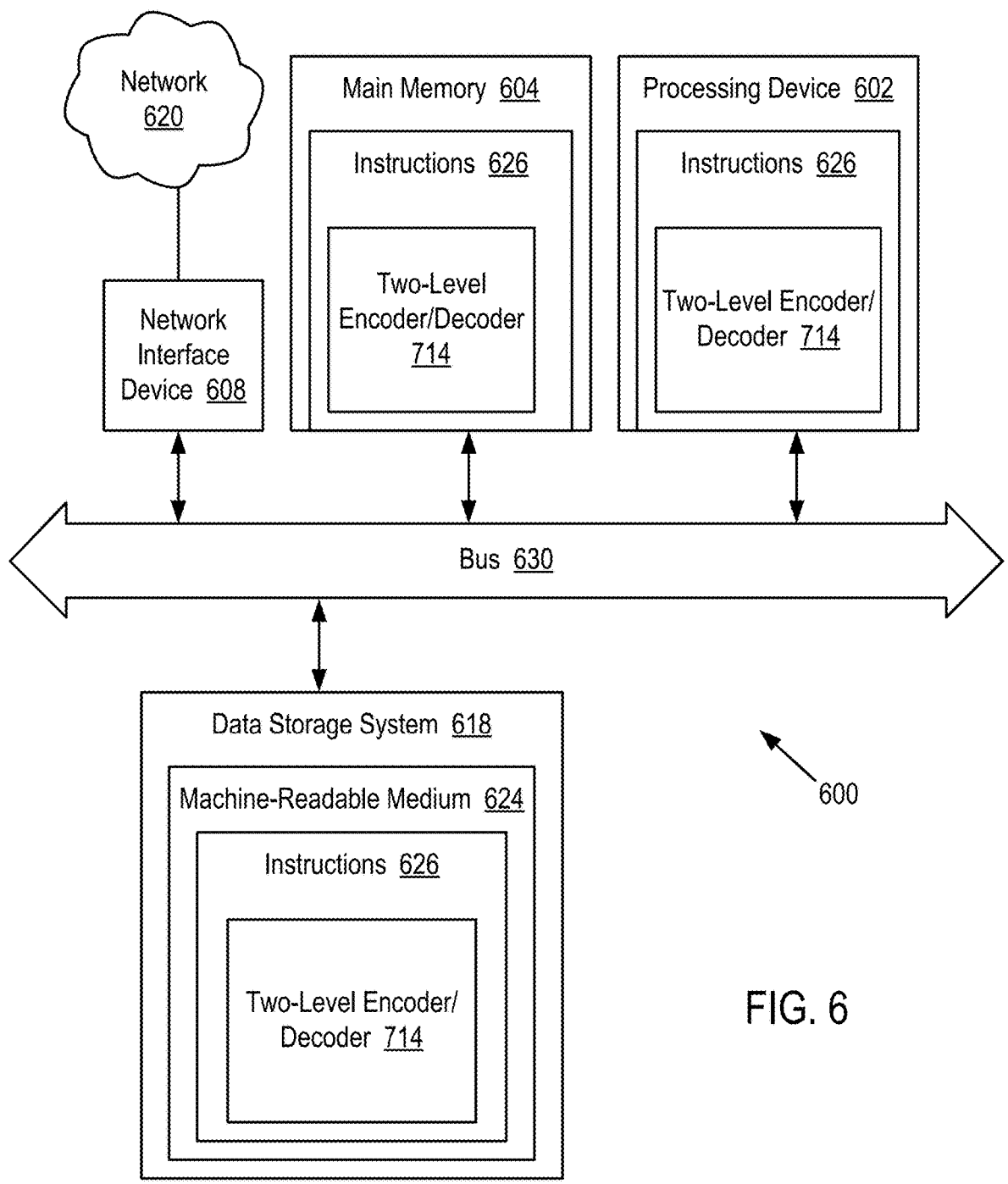
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 720 of FIG. 5) that includes, is coupled to, or utilizes a memory sub-system (e.g., the memory sub-system 710 of FIG. 5), or can be used to perform the operations of two-level encoder/decoder 714 (e.g., to execute instructions to perform operations corresponding to the two-level encoder/decoder 714 described with reference to FIG. 5). In one example, computer system 600 corresponds to memory device 102, and/or host device 103.

In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

In various embodiments, processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also referred to as a computer-readable medium herein) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 710 of FIG. 5. In one embodiment, the instructions 626 include instructions to implement functionality corresponding to two-level error correction for copying supported by a two-level encoder/decoder as described above (e.g., for FIG. 1) (e.g., the two-level encoder/decoder 714 described with reference to FIG. 5).

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
   non-volatile memory comprising a first partition and a second partition, wherein the first partition is configured to store data in memory cells each storing a single bit of data, and the second partition is configured to store data in memory cells each storing two or more bits of data; and
   a controller configured to:
     generate first error correction code (ECC) data for user data, wherein the first ECC data provides a first capability for correcting at least one error in the user data;
     store the user data and the first ECC data in the first partition;
     generate second ECC data for the user data, wherein a combination of the first ECC data and the second ECC data provides a second capability for correcting at least one error in the user data, and the second capability is able to correct a greater number of errors than the first capability;
     store the second ECC data outside of the first partition; and
     copy the user data to the second partition using a copyback operation or using error correction, wherein:
       copying the user data using the copyback operation comprises causing copying of the user data and the first ECC data to the second partition without error correction; and
       copying the user data using error correction comprises performing error correction for the user data using the combination of the first and second ECC data.

2. The system of claim 1, wherein the second ECC data is generated using the first ECC data.

3. The system of claim 1, wherein the combination of the first and second ECC data is a concatenation of the first and second ECC data.

4. The system of claim 1, wherein generating the first ECC data comprises generating a first parity check matrix.

5. The system of claim 4, wherein generating the second ECC data comprises generating a second parity check matrix using the first parity check matrix.

6. The system of claim 1, wherein the second ECC data is stored in memory cells each configured to store a single bit of data.

7. The system of claim 1, wherein the second ECC data is stored in the non-volatile memory outside of the first and second partitions.

8. The system of claim 1, wherein the first ECC data corresponds to a first code rate, the second ECC data corresponds to a second code rate, and the second code rate is smaller than the first code rate.

9. The system of claim 1, wherein copying the user data to the second partition is performed without copying the second ECC data.

10. The system of claim 1, wherein the copyback operation further comprises reading the user data from the first partition and writing the user data to the second partition without communicating any of the user data to the controller.

11. The system of claim 1, wherein the copyback operation is a NAND flash internal copyback operation.

12. A system comprising:
    non-volatile memory comprising a first partition and a second partition, wherein data stored in the first partition is stored in memory cells each configured to store charge representative of a single bit of data, and data stored in the second partition is stored in memory cells each configured to store charge representative of two or more bits of data; and
    a controller configured to:
      generate first error correction code (ECC) data for user data, wherein the first ECC data provides a first capability for correcting at least one error in the user data;
      store the user data and the first ECC data in the first partition;
      generate second ECC data for the user data, wherein a combination of the first ECC data and the second ECC data provides a second capability for correcting at least one error in the user data, and the second capability is able to correct a greater number of errors than the first capability;
      store the second ECC data outside of the first partition;
      determine a context associated with the stored user data; and
      copy the user data to the second partition using a copyback operation or using error correction, wherein:
        use of the copyback operation or the error correction is selected based on the determined context;
        copying the user data using the copyback operation comprises causing copying of the user data and the first ECC data to the second partition without error correction; and
        copying the user data using error correction comprises copying the user data to the second partition with error correction using at least one of the first ECC data or the second ECC data.

13. The system of claim 12, wherein copying the user data using error correction is performed using the combination of first and second ECC data in response to determining that using the first ECC data without the second ECC data is insufficient to correct at least one error in the user data.

14. The system of claim 12, wherein generating the second ECC data comprises generating the second ECC data as a function of the first ECC data.

15. The system of claim 12, wherein copying the user data to the second partition using error correction further comprises:

attempting error correction using the first ECC data without the second ECC data; and in response to determining a failure of the attempted error correction, performing error correction using the first and second ECC data.

16. The system of claim 12, wherein copying the user data to the second partition using error correction further comprises:

correcting at least one error in the user data to provide corrected user data;

generating, by an encoder, third ECC data for the corrected user data; and copying the corrected user data and the third ECC data to the second partition.

17. The system of claim 16, wherein the third ECC data provides the first capability for correcting at least one error in the user data.

18. The system of claim 12, wherein based on the determined context, the user data is copied using error correction to provide corrected user data; and the corrected user data is copied to the second partition.

19. The system of claim 18, wherein determining the context comprises determining that the user data has been stored in the first partition for a time period that exceeds a threshold.

20. The system of claim 18, wherein determining the context comprises determining that an error rate associated with the stored user data is greater than a threshold.

21. The system of claim 18, wherein determining the context comprises evaluating at least one temperature associated with the stored user data.

22. The system of claim 21, wherein evaluating the temperature associated with the stored user data comprises determining at least one of a temperature when the user data was stored in the first partition, or a temperature when copying the user data to the second partition.

23. The system of claim 18, wherein determining the context comprises determining a number of program-erase cycles associated with the first partition.

24. The system of claim 12, wherein the controller is further configured to:

receive a write command from a host device;

wherein the user data is stored in the first partition in response to receiving the write command.

25. The system of claim 12, wherein the first ECC data comprises first parity bits for a low-density parity check (LDPC) code.

26. The system of claim 25, wherein the second ECC data comprises second parity bits for the LDPC code.

27. The system of claim 12, wherein the controller is further configured to:

determine an availability of at least one of processing resources or communication resources;

wherein copying the user data to the second partition is performed in response to determining that the availability is above a threshold.

28. The system of claim 27, wherein the processing resources include a processing capability of at least one processing device.

29. A method comprising:

storing user data in a first partition of a non-volatile memory, wherein data stored in the first partition is stored in memory cells each configured to store charge representative of a single bit of data;

generating first error correction code (ECC) data for the user data, wherein the first ECC data provides a first capability for error correction of the user data;

storing the first ECC data in the first partition, wherein the first ECC data is associated with the stored user data;

generating second ECC data for the user data, wherein a combination of the first ECC data and the second ECC data provides a second capability for error correction of the user data, and the second capability is greater than the first capability;

storing the second ECC data outside of the first partition; and copying the user data and the first ECC data from the first partition to a second partition of the non-volatile memory, but without copying the second ECC data to the second partition, wherein data stored in the second partition is stored in memory cells each configured to store charge representative of two or more bits of data.

30. The method of claim 29, wherein copying the user data comprises:

determining whether an error rate associated with the stored user data is greater than a threshold; and in response to determining that the error rate is greater than the threshold, correcting at least one error in the user data using the combination of the first ECC data and the second ECC data to provide corrected user data;

wherein the corrected user data is written to the second partition.

31. The method of claim 29, wherein copying the user data comprises:

determining whether an error rate associated with the stored user data is less than a threshold;

wherein the user data is copied from the first partition to the second partition using a copyback operation in response to determining that the error rate is less than the threshold.

32. The method of claim 29, wherein the user data and the first ECC data are copied from the first partition to the second partition as part of a copyback operation.

33. The method of claim 32, wherein the copyback operation does not perform any error correction of the user data.

* * * * *